(12) United States Patent
Cayrefourcq et al.

(10) Patent No.: US 7,176,108 B2
(45) Date of Patent: Feb. 13, 2007

(54) METHOD OF DETACHING A THIN FILM AT MODERATE TEMPERATURE AFTER CO-IMPLANTATION

(76) Inventors: Ian Cayrefourcq, 74, chemin du Theys, 38330 Saint Nazaire les Eymes (FR); Nadia Ben Mohamed, 8, Hameau du grand pre, 38140 Renage (FR); Christelle Lagahe-Blanchard, route de la cascade, 38134, Saint Joseph de Riviere (FR); Nguyet-Phuong Nguyen, 65, rue Joseph Bouchayer, 38100 Grenoble (FR)

( * ) Notice: Subject to any disclaimer, the term of this patent is extended or adjusted under 35 U.S.C. 154(b) by 0 days.

(21) Appl. No.: 10/703,694

(22) Filed: Nov. 6, 2003

(65) Prior Publication Data

US 2004/0171232 A1 Sep. 2, 2004

Related U.S. Application Data

(60) Provisional application No. 60/440,836, filed on Jan. 17, 2003.

(51) Int. Cl.
*H01L 21/30* (2006.01)
*H01L 21/425* (2006.01)

(52) U.S. Cl. ............... 438/458; 438/473; 438/515; 438/519

(58) Field of Classification Search ......... 438/458, 438/455, 471, 473, 515, 519
See application file for complete search history.

(56) References Cited

U.S. PATENT DOCUMENTS

| | | | |
|---|---|---|---|
| 4,028,149 A | 6/1977 | Deines et al. | |
| 4,254,590 A | 3/1981 | Eisele et al. | |
| 5,242,863 A | 9/1993 | Xiang-Zheng et al. | |
| 5,374,564 A | 12/1994 | Bruel | |
| 5,400,458 A | 3/1995 | Rambosek | |
| 5,405,802 A | 4/1995 | Yamagata et al. | |
| 5,559,043 A | 9/1996 | Bruel | |

(Continued)

FOREIGN PATENT DOCUMENTS

| EP | 0 410 679 A1 | 1/1991 |
|---|---|---|
| EP | 0 293 049 B1 | 9/1993 |
| EP | 0 793 263 A2 | 9/1997 |
| EP | 0 801 419 A1 | 10/1997 |
| EP | 0 807 970 A1 | 11/1997 |

(Continued)

OTHER PUBLICATIONS

Agarwal, A. et al., "Efficient Production of Silicon-On-Insulator Films by Co-Implantation of He+ with H+," *American Institute of Physics*, vol. 72, No. 9, Mar. 2, 1998, pp. 1086-1088.

(Continued)

*Primary Examiner*—Hsien-Ming Lee
(74) *Attorney, Agent, or Firm*—Brinks Hofer Gilson & Lione

(57) ABSTRACT

A method of detaching a thin film from a source substrate comprises the steps of implanting ions or gaseous species in the source substrate so as to form therein a buried zone weakened by the presence of defects; and splitting in the weakened zone leading to the detachment of the thin film from the source substrate. Two species are implanted of which one is adapted to form defects and the other is adapted to occupy those defects, the detachment being made at a temperature lower than that for which detachment could be obtained with solely the dose of the first species.

21 Claims, 1 Drawing Sheet

U.S. PATENT DOCUMENTS

| | | |
|---|---|---|
| 5,811,348 A | 9/1998 | Matsushita et al. |
| 5,854,123 A | 12/1998 | Sato et al. |
| 5,887,070 A | 3/1999 | Iseberg et al. |
| 5,909,627 A | 6/1999 | Egloff |
| 5,920,764 A | 7/1999 | Hanson et al. |
| 5,953,622 A | 9/1999 | Lee et al. |
| 5,966,620 A | 10/1999 | Sakaguchi et al. |
| 5,993,677 A | 11/1999 | Biasse et al. |
| 5,994,207 A | 11/1999 | Henley et al. |
| 6,013,563 A | 1/2000 | Henley et al. |
| 6,020,252 A | 2/2000 | Aspar et al. |
| 6,048,411 A | 4/2000 | Henley et al. |
| 6,054,370 A | 4/2000 | Doyle |
| 6,071,795 A | 6/2000 | Cheung et al. |
| 6,103,597 A | 8/2000 | Aspar et al. |
| 6,103,599 A | 8/2000 | Henley et al. |
| 6,127,199 A | 10/2000 | Inoue et al. |
| 6,146,979 A | 11/2000 | Henley et al. |
| 6,150,239 A * | 11/2000 | Goesele et al. ............. 438/458 |
| 6,190,998 B1 | 2/2001 | Bruel et al. |
| 6,225,190 B1 | 5/2001 | Bruel et al. |
| 6,225,192 B1 | 5/2001 | Aspar et al. |
| 6,271,101 B1 | 8/2001 | Fukunaga |
| 6,303,468 B1 | 10/2001 | Aspar et al. |
| 6,323,108 B1 | 11/2001 | Kub et al. |
| 6,323,109 B1 | 11/2001 | Okonogi |
| 6,346,458 B1 | 2/2002 | Bower |
| 6,362,077 B1 | 3/2002 | Aspar et al. |
| 6,513,564 B2 | 2/2003 | Bryan et al. |
| 6,534,380 B1 | 3/2003 | Yamauchi et al. |
| 6,593,212 B1 | 7/2003 | Kub et al. |
| 6,607,969 B1 | 8/2003 | Kub et al. |
| 6,727,549 B1 | 4/2004 | Doyle |
| 6,756,286 B1 | 6/2004 | Moriceau et al. |
| 6,770,507 B2 | 8/2004 | Abe et al. |
| 6,946,365 B2 | 9/2005 | Aspar et al. |
| 2002/0025604 A1 | 2/2002 | Tiwari |
| 2002/0153563 A1 | 10/2002 | Oguara |
| 2002/0185684 A1 | 12/2002 | Campbell et al. |
| 2003/0077885 A1 | 4/2003 | Aspar et al. |
| 2003/0134489 A1 | 7/2003 | Schwarzenbach et al. |
| 2003/0162367 A1 | 8/2003 | Roche |
| 2003/0199105 A1* | 10/2003 | Kub et al. ...................... 438/3 |
| 2004/0144487 A1 | 7/2004 | Martinez et al. |

FOREIGN PATENT DOCUMENTS

| | | |
|---|---|---|
| EP | 0 917 193 A1 | 5/1999 |
| EP | 0 938 129 A1 | 8/1999 |
| EP | 0 533 551 B1 | 3/2000 |
| EP | 0 902 843 B1 | 3/2000 |
| EP | 0 994 503 A1 | 4/2000 |
| EP | 1 050 901 A2 | 11/2000 |
| EP | 0 717 437 B1 | 4/2002 |
| EP | 0 786 801 A1 | 6/2003 |
| EP | 0 767 486 B1 | 1/2004 |
| EP | 0 925 888 B1 | 11/2004 |
| EP | 1 014 452 B1 | 5/2006 |
| FR | 2 681 472 A1 | 3/1993 |
| FR | 2 748 851 | 11/1997 |
| FR | 2 758 907 A1 | 7/1998 |
| FR | 2 767 416 A1 | 2/1999 |
| FR | 2 773 261 | 7/1999 |
| FR | 2 774 510 A1 | 8/1999 |
| FR | 2 748 850 A1 | 11/1999 |
| FR | 2 781 925 A1 | 2/2000 |
| FR | 2 796 491 | 1/2001 |
| FR | 2 797 347 | 2/2001 |
| FR | 2 809 867 | 12/2001 |
| FR | 2 847 075 A1 | 5/2004 |
| JP | 62265717 | 11/1987 |
| JP | 101004013 | 1/1989 |
| JP | 07-254690 | 10/1995 |
| JP | 7-302889 | 11/1995 |
| JP | 09-213594 | 8/1997 |
| JP | 09-307719 | 11/1997 |
| JP | 11045862 | 2/1999 |
| JP | 11-87668 | 3/1999 |
| JP | 11074208 | 3/1999 |
| JP | 11-145436 | 5/1999 |
| JP | 11-233449 | 8/1999 |
| WO | WO 99/08316 | 2/1999 |
| WO | WO 99/35674 A1 | 7/1999 |
| WO | WO 99/39378 | 8/1999 |
| WO | WO 00/48238 | 8/2000 |
| WO | WO 00/63965 | 10/2000 |
| WO | WO 01/11930 A2 | 2/2001 |
| WO | WO 02/47156 A1 | 6/2002 |
| WO | WO 02/083387 A1 | 10/2002 |
| WO | WO 03/013815 | 2/2003 |
| WO | WO 04/044976 | 5/2004 |

OTHER PUBLICATIONS

[Vol. 99-1] Meeting Abstract No. 333, Bruel et al., "Single-crystal semiconductor layer delamination and transfer through hydrogen implantation," The 195th Meeting of The Electrochemical Society, May 2-6, 1999, Seattle, Washington.

[Vol. 99-1] Meeting Abstract No. 405, Moriceau et al., "A New Characterization Process Used to Quality SOI Films," The 195th Meeting of The Electrochemical Society, May 2-6, 1999, Seattle, Washington.

Camperi-Ginestet et a., "Alignable Epitaxial Liftoff of GaAs Materials with Selective Deposition Using Polyimide Diaphragms", *IEEE Transactions Photonics Technology Letters*, vol. 3, No. 12, Dec. 1991, pp. 1123-1126.

Cerofolini et al. "Ultradense Gas Bubbles in Hydrogen-or-Helium-Implanted (or Co-implanted) Silicon", *Materials Science and Engineering*, B71, 2000, pp. 196-202.

Demeester, et al., "Epitaxial Lift-off and its Applications", *Semicond. Sci. Technol.*, vol. 8, 1993, pp. 1124-1135.

DiCioccio et al., "III-V layer transfer onto silicon and applications", *Phys. Stat. Sol.* (a), vol. 202, No. 4., 2002, pp. 509-515/DOI 10.1002/pssa. 200460411.

Feijoo et al., "Prestressing of Bonded Wafers", vol. 92-7 1992 pp. 230-238.

Feng et al., "Generalized Formula for Curvature Radius and Layer Stresses Caused by Thermal Strain in Semiconductor Multilayer Structures", *J. Appl. Phys.*, vol. 54, No. 1, 1983, pp. 83-85.

Hamaguchi, et al., "Novel LSI/SOI Wafer Fabrication Using Device Layer Transfer Technique" *Proc. IEDM*, 1985, pp. 668-691.

Henttinen et al. "Mechanically induced Si Layer Transfer in Hydrogen-Implanted Si-Wafers", *American Institute of Physics*, vol. 76, No. 17, Apr. 2002, pp. 2370-2372.

Kucheyev et al., "Ion implantation into GaN", *Materials Science and Engineering*, 33, 2001, pp. 51-107.

Liu et al., "Ion implantation in GaN at liquid-nitrogen temperature: Structural characteristics and amorphization," *Physical Review B of The American Physical Society*, vol. 57, No. 4, 1988, pp. 2530-2535.

Pollentier et al., "Fabrication of High-Radiance LEDs by Epitaxial Lift-off" *SPIE*, vol. 1361, 1990, pp. 1056-1062.

Suzuki et al., "High-Speed and Low Power n -p Double-Gate SOI CMOS", IEICE Trans. Electron., vol. E78-C, No. 4, Apr. 1995, pp. 360-367.

Timoshenko, S., "Analysis of Bi-Metal Thermostats", *J.Opt.Soc. Am.*, 11, 1925, pp. 233-256.

Tong et al, "Low Temperature SI Layer Splitting", *Proceedings 1997 IEEE International SOI Conference*, Oct. 1997, pp. 126-127.

Wong et al., "Integration of GaN Thin Films with Dissimilar Substrate Materials by Pd-In Metal Bonding and Laser Lift-off", *Journal of Electronic Materials*, vol. 28, No. 12, 1999, pp. 1409-1413.

Yun et al., "Fractional Implantation Area Effects on Patterned Ion-Cut Silicon Layer Transfer," Dept. of Electrical Eng. And Computer Sciences, University of California, Berkeley, Ca 94720, USA, 1999 IEEE International SOI Conference, Oct. 1999, pp. 129-30.

Yun et al., "Thermal and Mechanical Separations of Silicon Layers from Hydrogen Pattern-Implanted Wafers," Journal of Electronic Materials, vol. No. 36, Nov. 8, 2001.

* cited by examiner

METHOD OF DETACHING A THIN FILM AT MODERATE TEMPERATURE AFTER CO-IMPLANTATION

This application claims priority to U.S. Provisional Application No. 60/440,836 filed Jan. 17, 2003.

This application claims priority to French patent application No. 0231035 filed Nov. 7, 2002.

TECHNICAL FIELD

The present invention relates to a method of detaching a thin film from a substrate.

The invention has applications in particular in the fields of micro-electronics, micro-mechanics, integrated optics and integrated electronics.

BACKGROUND

The detachment of a thin film from the remainder of the a source substrate is based on the observation that an implantation of chemical species in the source substrate may induce the formation of a zone of defects at a given depth. These defects may be micro-bubbles and/or platelets and/or micro-cavities and/or dislocation loops and/or other crystalline defects, disrupting the crystalline quality of the material, of which the nature, the density and the size are strongly dependent on the species implanted as well as on the nature of the source substrate. A heat-treatment may then be applied to enable the development of specific defects present in the weakened zone, which will enable the detachment of the thin film from the source substrate to be obtained later. This has in particular been described in U.S. Pat. No. 5,374,564 and developments thereof, such as described in U.S. Pat. No. 5,374,564.

The implantation step has been the subject of numerous research projects and studies in the specific field of SOI. In that context the problem to resolve is generally to reduce the implantation doses in order, on the one hand, to reduce the costs of manufacture by reducing the time of use of the machine, and, on the other hand, from a technological point of view, to reduce the zone damaged by the implantation.

Thus, for example, Agarwal et al (1997) gave an account, in "Efficient production of silicon-on-insulator films by co-implantation of $He^+$ with $H^+$", Applied Physics Letters, Volume 72, Number 9, 2 Mar. 1998, of trials carried out by applying ions of two types, that is to say a co-implantation of the two species hydrogen and helium, in a silicon substrate. The authors specify that the implantation profiles of the two implanted species must be localized at the same depth, around which the concentration in implanted species is maximum and it is at that location that propagation of the splitting will be induced. The authors teach that the order of implantation of the two implanted species is important: hydrogen must be implanted first, helium second. They comment that it is thus possible to reduce the total implanted dose by a factor of the order of three in relation to the use of each species alone.

More particularly, this document discloses trials with low doses ($7.5 \times 10^{15}$ $H^+/cm^2$ and $1 \times 10^{16}$ $He/cm^2$; or $1 \times 10^{16}$ $H^+/cm^2$ and $1 \times 10^{16}$ $He/cm^2$) on the SOI. The detachment is then obtained at a usual temperature (500° C.) with a low total implanted dose.

It may be noted that this document describes an experimental approach and gives little importance to the target substrate.

Similar teachings may be found in U.S. Patent Publication No. 2002/0025604 which concerns a low-temperature semiconductor layering and three-dimensional electronic circuits using the layering. Such layering method includes several steps. First hydrogen and then helium are implanted at doses between $1 \times 10^{16}/cm^2$ and $4 \times 10^{16}/cm^2$ with a range that is close to each other. Implanted wafer is then bonded to another wafer. The bonded wafers are then annealed at low temperature between 200–250° C. for 1 to 48 hours and annealed at 400–600° C. for 1 to 10 minutes so that a portion of the wafer is detached. This document concerns layering silicon on a silicon substrate.

The problem is posed in a very different manner in the case of heterostructures, that is to say in the case in which the materials of the source and target substrates are different. In this case, one of the major technological problems encountered is the presence of a field of very high stress in the various layers in contact, during the heat-treatment such as that during which the detachment of the thin film from the remainder of the source substrate occurs: this stress field is due to the difference in coefficients of thermal expansion between the various materials brought into contact.

Thus, in the case of substrates with different thermal expansion coefficients (heterostructure), it is important to manage to achieve the detachment at a lower temperature than the critical temperature at which the heterostructure will be degraded on account of the aforementioned mechanical stresses. This degradation may typically result in the breakage of one or both substrates brought into contact and/or in the substrates becoming unbonded at the bonding interface. For example, in a heterostructure comprising a implanted substrate of Si bonded to a fused silica substrate, the detachment of the Si layer on the fused silica substrate is accompanied by the breakage of the substrates if the heterostructure is subjected to a heat-treatment at 500° C. It is thus desirable to reduce the heat-treatment temperature to avoid the breakage or any damage of the heterostructure (and/or of the two substrates obtained after detachment) and to maintain a good quality for the transferred layer.

The same need to be able to use a relatively low detachment temperature is met when compounds are formed in one of the substrates (for example in the future thin film) and are liable to be degraded during a heat-treatment which is too aggressive.

One way to reduce the temperature of obtainment of the detachment is to "play" with the implantation conditions. For example, an excess dose of the implanted species makes it possible to reduce the thermal budget for detachment, thermal budget being understood to mean the pair Length of heat-treatment/Temperature of heat-treatment.

Bruel et al. (ECS Spring Meeting 1999) have thus shown that if the source substrate is a wafer of silicon, a dose of hydrogen ions implanted at $1 \times 10^{17}$ $H/cm^2$, instead of at $5.5 \times 10^{16}$ $H/cm^2$, makes it possible, for a limited duration of heat-treatment of a few hours, to reduce the detachment temperature from 425° C. to 280° C.

This approach, although reducing the thermal budget for detachment, uses an implantation at high dose which may represent a significant drawback from an industrial point of view (high cost). Furthermore, it is of note that, due to the high implanted dose, the disrupted zone (comprising defects related to the implantation) at the surface of the transferred layer is thicker and the later processing operations necessary to eliminate that disrupted superficial zone may be more restrictive (greater removal of material, corresponding to more costly processing and potentially increasing the risks of lack of homogeneity of the thickness of the transferred layer).

Another idea to reduce the temperature of detachment is described in U.S. Pat. No. 5,877,070 to Gosele et al. It consists in implanting firstly an element involving the formation of hydrogen traps (in particular boron, carbon, phosphorus, nitrogen, arsenic or fluorine, that is to say elements of considerable size) then implanting the hydrogen in the source substrate, and in carrying out an operation of prior annealing before bonding of the source and target substrates. According to the inventors this enables the detachment temperature to be reduced by 50% in comparison with the case of implantation of $H^+$ alone. The invention relies on two steps: co-implantation (in which the hydrogen is introduced secondly) and a pre-annealing of the source substrate.

The invention relates to a method of detaching a thin film from a source substrate (for example fixed beforehand onto a target substrate, advantageously of a different material to that of the source substrate), which does not require implantation doses that are too high nor the annealing of the source substrate after implantation (and, where the case arises, before its bonding onto the target substrate), while permitting the detachment at a temperature sufficiently low not to induce, when the source substrate is fixed to a target substrate and when their coefficients of thermal expansion are different, prohibitive mechanical stresses on the heterostructure constituted by the two substrates, and/or not to risk degrading components which may have been formed on one of the substrates before detachment.

SUMMARY

The invention advantageously provides a transfer of a thin film from a substrate, referred to as source substrate, to a support referred to as target substrate, applicable in particular in the case where the target substrate is made from a different material to that of the source substrate (the term heterostructure is then used). This target substrate can just be an intermediate support from which the thin film will later be detached.

Conventionally, the source substrate is fixed, for example, by molecular bonding, by one of its surfaces to the target substrate, then a thin film of the source substrate which extends along the target substrate is detached from the remainder of the source substrate, on which the procedure may then be iterated.

It makes it possible, for example, to produce assemblies referred to as structures in which the thin film, which is of a material selected for its physical properties, is transferred to a support in order to form a stack of several layers (two or more). Thus, the advantages of the materials of the thin film and of the support may be combined. The transfer of a thin film may in particular make it possible to associate in a single structure parts which prima facie have incompatibilities such as a large difference in thermal expansion coefficients (for example: silicon on fused silica SOQ, SiC on silicon, etc.)

The target substrate is not necessarily a bulk support. Thus the invention also relates to the case in which a single thick layer is deposited on the implanted face (or on the face to be implanted); after detachment, a "self-supporting" thin film is obtained which may then, if useful, be fixed to a bulk target substrate.

Thin film is conventionally understood to mean a layer of which the thickness is of the order of a few tens of angstroms to several microns. A thick layer is thus a layer having a thickness typically of at least several microns, or even several tens of microns.

To that end, the invention provides a method of detaching a thin film from a source substrate comprising the following steps:
(a) implanting ions or gaseous species in the source substrate so as to form therein a buried zone weakened by the presence of defects;
(b) splitting in the weakened zone leading to the detachment of the thin film from the source substrate,
wherein the implanting step comprises implanting a first species that is adapted to form defects and implanting a second species at substantially the same depth as the first species that is adapted to occupy the defects, wherein implanting the first species is carried out at a dose sufficient to permit, detachment of the thin film at a first temperature, and wherein implanting the second species is carried out at a dose lower than the dose of the first species, and
wherein the step of splitting is carried out at a second temperature that is less than the first temperature.

The invention is thus based on the implantation of two different species, characterized by different levels of efficacy to jointly form a weakened zone in the source substrate. One of the implanted species is chosen so as to localize the zone in which detachment will later occur by the formation of specific defects, the other is chosen to form a gas reservoir which will promote the extension of the specific defects designated previously, in particular by increasing their internal pressure.

Preferentially, the implantation of the first species, creating defects which promote detachment, is made firstly whereas the implantation of the other species, made so as to localize that second species in the zone of the defects created by the first species, is made secondly. This implantation order makes it possible to obtain a more favorable detachment dynamic.

In other words, implantation is advantageously carried out firstly of the first species, which has a high level of efficacy in creating a weakened layer (weakened is understood to mean the formation of specific defects of the micro-cavity and/or platelet etc. type), whereas, in this weakened layer, the second species, of lower efficacy in forming weakening defects, is implanted using a moderate dose. Being available in the weakened zone, the atoms of this second species will become trapped at or near the micro-cavities and/or platelets created at the time of the first implantation. At the time of the heat-treatment intended to induce detachment, the atoms of that second species will already be in place to participate in pressurizing the cavities present in the weakened layer and to enable their development; it follows from this that it is useful to choose as the second species a species having a high capacity to induce an effect of pressure in the cavities and/or micro-cracks located in the weakened layer. Nevertheless, it is possible to implant the second species first, which will later be available to progressively fill the defects which will be created by the implantation of the first species.

The first species is advantageously hydrogen (in one of its forms, for example in the form of $H^+$ ions), the modes of implantation of which are well known, but it should be understood that other species may be used. Furthermore, the second species is advantageously helium which makes it possible to efficaciously generate a pressurizing effect.

A radical difference of this method, with respect to the experimental technique described in the work of Agarwal, is that the dose implanted of the first species is sufficient to form a weakened zone enabling detachment at a first temperature: the dose of this first species thus remains within conventional levels of the order of about $10^{16}$ atoms/cm² for hydrogen. The implanted dose of the second species is moderate such that all the atoms of the second species substantially find their place in the defects created by the first, and/or they create the least possible other defects liable to be unfavorable to the propagation of splitting; and the detachment is carried out at a second temperature which is less than the first temperature.

In comparison with U.S. Pat. No. 5,877,070, in which the dose recommended for the species intended to generate defects (boron, for example) is much less than the dose of the hydrogen (typically between 0.1% and 1% of that dose) and in which intermediate annealing is imperative, the method of the invention teaches proportions that are the inverse and requires no intermediate heat-treatment (even if, of course, such an intermediate heat treatment remains possible provided that it is at a sufficiently low temperature not to commence detachment).

It may be noted that this method differs from the teaching of above discussed U.S. Patent Publication No. 2002/0025604 by the fact that the second species is implanted at a lower dose than the first one, and that the splitting is carried on at a temperature less than the one at which splitting would occur as a result of the first species only (about 500° C. in practice).

According to preferred provisions of the invention, possibly combined together:

implanting of the first species is carried out before that of the second species, The source substrate is made from a material chosen from the group consisting of semiconductors and insulators, single crystal, polycrystalline or amorphous; a semiconductor can thus be chosen from Group IV of the Periodic Table of the Elements, for example silicon (which corresponds to a case of great technical importance) and/or germanium; a Group III-V semiconductor of (for example AsGa or InP, in particular) may also be chosen; an insulator may also be chosen, for example lithium niobate ($LiNbO_3$) or lithium tantalite ($LiTaO_3$) in particular, the first species is hydrogen, advantageously $H^+$ hydrogen, which is a species which can be easily implanted in numerous substrates, in silicon or another, the first species (hydrogen or another) is implanted at a dose of the order of some $10^{16}$ atoms/cm², which is currently a typical dose for an implantation of hydrogen alone, and corresponds to well-known modes of implantation, the second species is helium, which interacts in a particularly efficient manner with defects produced by an implantation of $H^+$ ions, and which efficaciously enables pressurization to be made of crystalline defects; the helium is advantageously implanted at a dose on the order of $1 \times 10^{16}$ He/cm² and $5 \times 10^{16}$ He/cm², which is a usual implantation dose in various substrates, and thus is easy to implement.

generally, but this also applies in particular when the source substrate is of silicon and/or of one of its compounds (oxides, carbides, etc.), the first temperature (that for which splitting would be achieved with just the first species) is of the order of 500° C. (a typical splitting temperature, in particular for hydrogen in silicon) and the second temperature (that for which splitting is actually carried out) is less than of the order of 300° C., which keeps the mechanical forces at a bearable level even in case of significant difference between the coefficients of thermal expansion of the two substances, the source substrate is, before splitting in the weakened zone, bonded by its implanted face to a target substrate, forming according to need an intermediate or final support, the splitting is followed by a step of thermal stabilization of the bonding between the target substrate and the thin film, the target substrate is made from single crystal or polycrystalline material (for example of sapphire) or is amorphous (for example fused silica, glass of any kind or even polymers), it being noted that sapphire and fused silica are cases currently of real practical importance, the target substrate is of fused silica, or of sapphire, which correspond to cases currently being of real practical importance; but generally, the target substrate may be any single crystal or polycrystalline type, or even be amorphous (for example types of glass or polymers).

the difference in dose between the two species is significant, that is to say that it is preferably at least 10%, preferably, the source substrate and the target substrate are brought into intimate contact by direct bonding. (it is known how to deal well with the parameters which enable solidity to be controlled, which makes this means of fixation particularly easy to implement), in variant form, before splitting within the weakened zone, a stiffening layer is deposited on the implanted face of the source substrate.

Aims, features and advantages of the invention will appear from the following description, given by way of illustrative non-limiting example, with reference to the accompanying drawings.

DETAILED DESCRIPTION OF THE PREFERRED EMODIMENTS

Figure 1:
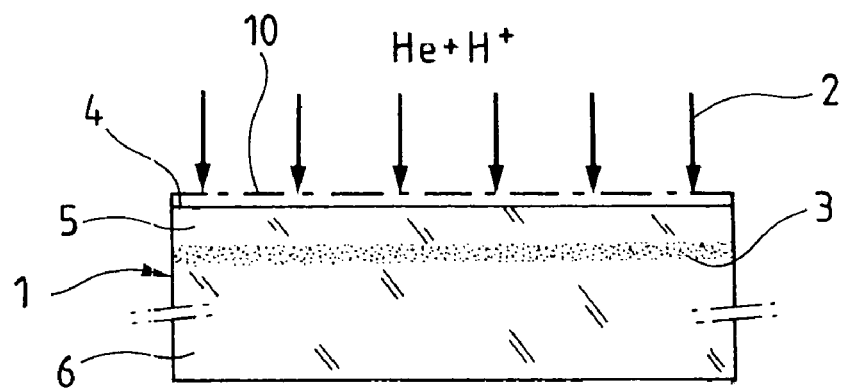
FIG. 1 is a diagram of a source substrate in course of implantation.

FIG. 1 shows a substrate 1, for example of silicon advantageously oxidized on its surface 4, which may be covered by a protective layer 10, in course of being subjected to an implantation treatment, symbolized by the arrows 2, for example by bombardment with ions or gaseous species.

This implantation involves, at the same given depth, two species, one of which is adapted to form defects, for example $H^+$ hydrogen, and the other, for example helium, is adapted to occupy the defects formed previously or subsequently by that first species.

The implantation of the first species is carried out at a sufficient dose for it, by itself, to enable later detachment at a first temperature (see below), whereas the dose of the second species is lower than it.

Commencement is advantageously made by implanting the first species, hydrogen in the example considered (even if the second species may, as a variant, be implanted first). The second species is then implanted at a dose which advantageously just allows it to fill the defects generated by the first species and/or which creates the least possible other defects liable to be unfavorable for obtaining splitting later.

A buried zone 3 results from this, weakened by the presence of defects, principally generated by the first species, to the development of which the second species will contribute, in particular by its capability to pressurize those defects.

The weakened zone 3 delimits, within the source substrate, a future thin film 5 and a substrate remainder 6, that is to say that which remains of the source substrate after detachment of the thin film; this remainder will be able to serve as source substrate for an iteration of the procedure.

Figure 2:
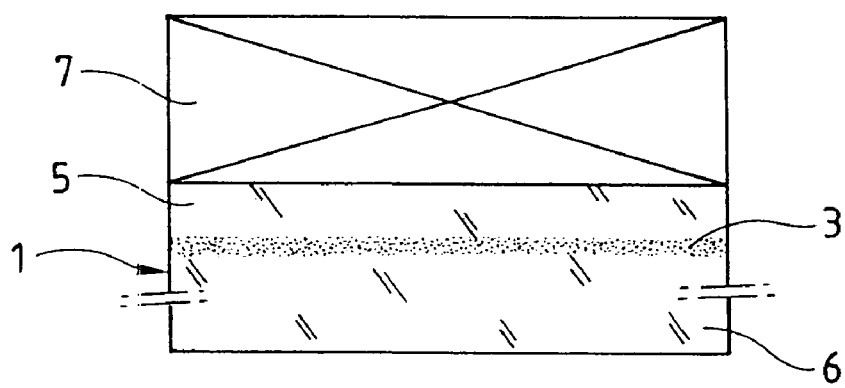
FIG. 2 is a later view of same after bonding to a target substrate.

FIG. 2 represents a step during the course of which the source substrate, containing the buried weakened zone, is joined by its face 4 with a target substrate 7, for example by direct molecular bonding.

Figure 3:
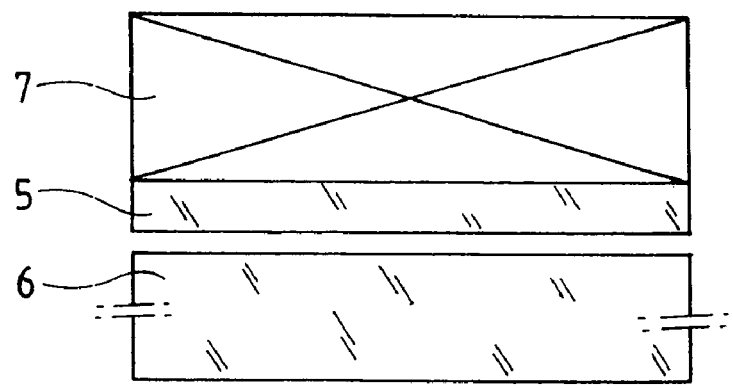
FIG. 3 is a view of same in course of detachment of a thin film deriving from the source substrate.

In a later step, without any intermediate heat-treatment being necessary, detachment of the thin film from the remainder of the source substrate is carried out as represented in FIG. 3, by splitting in the weakened zone. This splitting is carried out at a lower temperature than that for which splitting could have been obtained after implantation of solely the first species. This second temperature for the step of FIG. 3 is advantageously lower by at least of the order of 200° C. to that for which detachment could be obtained with the implanted dose of solely the first species; thus, if the first temperature is of the order of 500° C. the actual splitting or detachment temperature is advantageously at most 300° C. Of course, these temperatures persist for reasonable periods of treatment, typically between a few tens of minutes and a few hours (for example up to 3 hours). In other words, the thermal budgets (temperature-duration pairs) are industrially realistic.

This detachment step may comprise, in addition to a thermal effect, the application of forces for example mechanical forces; in such case, what is stated in relation to the first and second temperatures also applies in the same way to the application of forces, that is to say that the first temperature would enable detachment after implantation of solely the first species on a given application of mechanical forces, but that detachment is obtained at the second temperature by the same application of mechanical forces.

This detachment or splitting step is advantageously followed by a step of thermal stabilization of the bonding between the target substrate 7 and the thin film. This step may include some time at a temperature above 1000° C., preferably at about 1000° C.; this treatment may be conducted at a constant temperature, or at a varying temperature (for example oscillating between two values). It helps to prevent defects at the bonding interface or to prevent disbanding of the film layer from the target substrate.

The source substrate 1 may not only be of silicon but more generally of any appropriate known material (for example a Group III-V semiconductor), single crystal or polycrystalline or even amorphous. As for the target substrate 7, this may be of a wide variety of materials, to be chosen according to needs, single crystal, or polycrystalline (for example semiconductors) or even be amorphous (for example types of glass or polymers, etc.).

EXAMPLES

According to a first embodiment of the invention, a substrate of Si (~700 µm) comprising a layer of thermal $SiO_2$ on the surface (for example 200 nm) may be implanted initially with hydrogen atoms under implantation conditions of $4.5 \times 10^{16}$ $H/cm^2$ at 3.5 keV and then be implanted with helium under the conditions of $2 \times 10^{16}$ $He/cm^2$ at 4.5 keV. This source substrate may next be joined to a target substrate of fused silica (~1000 µm) by direct bonding. The difference that exists between the coefficients of thermal expansion of these two materials ($2.56 \times 10^{-6}$/° C. for silicon and $0.5 \times 10^{-6}$/° C. for fused silica, at ambient temperature) makes it necessary to perform a heat-treatment for detachment at low temperature, typically being around 250–300° C. A heat-treatment around 275° C. next induces the growth of the cavities localized at the peak hydrogen level, the helium atoms participating in the pressurization and in the development of those cavities. Final splitting at the level of the hydrogen profile leads to the transfer of the Si layer onto the substrate of fused silica, without breakage or degradation of either of the substrates derived from the heterostructure after splitting (the fused silica substrate having the thin film of Si on the one hand, and the initial Si substrate having had the superficial thin film peeled from it on the other hand).

According to another embodiment of the invention, a substrate of Si (~300 µm) comprising a layer of thermal $SiO_2$ on the surface (for example 400 nm) may be implanted initially with hydrogen atoms under implantation conditions of $6 \times 10^{16}$ $H/cm^2$ at 95 keV and then be implanted with helium under the conditions of $2 \times 10^{16}$ $He/cm^2$ at 145 keV. This source substrate may next be joined to a target substrate of sapphire (~500 µm) by direct bonding. A layer of oxide will optionally have been deposited on the surface of the sapphire substrate before bonding. The difference that exists between the coefficients of thermal expansion of these two materials ($2.56 \times 10^{-6}$/° C. for silicon and $5 \times 10^{-6}$/° C. for sapphire, at ambient temperature) makes it necessary, in the case of thick substrates, to perform a heat-treatment for detachment at low temperature, typically being less than 250° C. A heat-treatment around 200° C. next induces the growth of the cavities localized at the peak hydrogen level, the helium atoms participating in the pressurization and in the development of those cavities. Final splitting at the hydrogen profile leads to the transfer of the Si layer on the sapphire substrate, without breakage or degradation of either of the substrates derived from the heterostructure after detachment (the sapphire substrate having the thin film of Si on the one hand, and the initial Si substrate having had the superficial thin film peeled from it on the other hand).

It may be noted that in the two aforementioned examples, the dose of the second species is at most equal to half of the dose of the first step.

According to a further embodiment a silicium substrate comprising a layer of thermal $SiO_2$ (of about 200 nm) may be implanted first with Helium atoms under implant conditions of $1 \times 10^{16}$ $H/cm^2$ at 100 keV and then implanted with Hydrogen at $4 \times 10^{16}$ $H/cm^2$ at 52 keV. This source substrate is then joined to handle silicium substrate. A heat treatment around 275° C. for less than 15 hours is conducted to induce growth of cavities localized at the peak of hydrogen concentration level, the helium atoms participating in the pressurization of the cavities by their migration. Final splitting at the same low temperature is obtained and leads to the transfer of a silicum layer on the handle silicium substrate.

In variant forms which are not detailed:

the source substrate is another semiconductor of column IV, such as germanium, the source substrate is a semiconductor compound, for example of III-V type, for example AsGa or InP in particular.

the source substrate is an insulator, for example of niobate or tantalite type, such as $LiNbO_3$ or $LiTaO_3$, in particular, the target substrate is made from a crystalline material other than sapphire, the target substrate is made from another amorphous material such as a glass other than fused silica or from a polymer, the target substrate is a simple stiffening layer, for example of oxide a few tens of nanometers thick, deposited by any appropriate technique of deposit; it no longer corresponds to a bulk target substrate as in the represented cases.

the target substrate, when present, can just be an intermediate support.

The invention claimed is:

1. A method of detaching a thin film from a source substrate comprising the steps of:
   (a) implanting ions or gaseous species in the source substrate so as to form therein a buried zone weakened by the presence of defects,
      wherein implanting comprises implanting a first species that is adapted to form defects and implanting a second species that is adapted to occupy the defects,
      wherein implanting the first species is carried out at a dose sufficient to permit detachment of the thin film at a first temperature in the absence of the second species, and
      wherein implanting the second species is carried out at an implant dose lower than an implant dose of the first species; and
   (b) splitting in the weakened zone leading to the detachment of the thin film from the source substrate,
      wherein the step of splitting is carried out at a second temperature that is less than the first temperature.

2. A method of detaching a thin film from a source substrate comprising the steps of:
   (a) implanting ions or gaseous species in the source substrate so as to form therein a buried zone weakened by the presence of defects; and
   (b) splitting in the weakened zone leading to the detachment of the thin film from the source substrate,
      wherein the implanting step comprises implanting a first species that is adapted to form defects and then implanting a second species at substantially the same depth as the first species that is adapted to occupy the defects, wherein implanting the first species is carried out at a dose sufficient to permit detachment of the thin film at a first temperature, and wherein implanting the second species is carried out at a dose lower than the dose of the first species,
      wherein the step of splitting is carried out at a second temperature that is less than the first temperature.

3. A method according to claim 1, wherein the source substrate comprises a material selected from the group consisting of semiconductors, insulators, single crystal materials, polycrystalline materials, and amorphous materials.

4. A method according to claim 3, wherein the source substrate comprises Group IV semiconductors.

5. A method according to claim 4, wherein the source substrate comprises silicon.

6. A method according to claim 3, wherein the source substrate comprises a type III-V semiconductor material.

7. A method according to claim 3, wherein the source substrate comprises an insulator selected from the group consisting of $LiNbO_3$ and $LiTaO_3$.

8. A method according to claim 1, wherein the first species comprises hydrogen.

9. A method according to claim 8, wherein the first species comprises hydrogen $H^+$ ionic.

10. A method according to claim 1, wherein the first species is implanted at a dose of about $10^{16}$ atoms/cm$^2$.

11. A method according to claim 1 wherein the second species comprises helium.

12. A method according to claim 11, wherein the helium is implanted at a dose of about $1\times10^{16}$ to $5\times10^{16}$ atoms/cm$^2$.

13. A method according to claim 1, wherein the first temperature is about 500° C. and the second temperature is less than about 300° C.

14. A method according to claim 1, wherein before the step of splitting in the weakened zone, the method further comprises bonding the implanted face of the source substrate to a target substrate.

15. A method according to claim 14, wherein the target substrate comprises an amorphous material.

16. A method according to claim 15, wherein the target substrate comprises fused silica.

17. A method according to claim 14, wherein the target substrate comprises one of a single crystal or polycrystalline material.

18. A method according to claim 17, wherein the target substrate comprises sapphire.

19. A method according to claim 14, wherein the source substrate and the target substrate are brought into intimate contact by direct bonding.

20. A method according to claim 14, wherein after the step of splitting, the method further comprises thermally stabilizing the bonding interface.

21. A method according to claim 1, wherein before the step of splitting in the weakened zone, the method further comprises depositing a stiffening layer on the implanted face of the source substrate.

* * * * *

UNITED STATES PATENT AND TRADEMARK OFFICE
CERTIFICATE OF CORRECTION

PATENT NO. : 7,176,108 B2  Page 1 of 1
APPLICATION NO. : 10/703694
DATED : February 13, 2007
INVENTOR(S) : Ian Cayrefourcq et al.

It is certified that error appears in the above-identified patent and that said Letters Patent is hereby corrected as shown below:

On the Title Page

In column 1, before "(*) Notice" insert the following:
--(73) Assignee: S.O.I. TEC Silicon On Insulator Technologies, Bernin (FR); Commisariat a l'Energie Atomique, Paris (FR)--.

In column 1, before item (51), insert the following:
--(30) Foreign Application Priority Data
November 7, 2002 (FR) 0231035--.

Page 2, column 1, line 17, under "U.S. PATENT DOCUMENTS", after "Inoue" delete "et al.".

Page 2, column 1, line 18, under "FOREIGN PATENT DOCUMENTS", delete "8/1999" and substitute --8/1997-- in its place.

Page 2, column 2, line 9, under "OTHER PUBLICATIONS", after "Camperi-Ginestet" delete "et a." and substitute --et al.-- in its place.

Page 2, column 2, line 19, under "OTHER PUBLICATIONS", after "No. 4.," delete "2002" and substitute --2005-- in its place.

Page 2, column 2, line 38, under "OTHER PUBLICATIONS", after "Low Power" delete "n -p" and substitute --$n^+$ -$p^+$-- in its place.

Signed and Sealed this

Twenty-seventh Day of November, 2007

JON W. DUDAS
*Director of the United States Patent and Trademark Office*